United States Patent [19]

[11] 3,870,576

[45] Mar. 11, 1975

Isitovsky et al.

[54] METHOD OF MAKING A PROFILED P-N JUNCTION IN A PLATE OF SEMICONDUCTIVE MATERIAL

[76] Inventors: Ilya Leonidovich Isitovsky, 15 Parkovaya ulitsa, 43, korpus 2, kv. 39; Grigory Avrumovich Zelikman, ulitsa Alexeya Tolstoga, 26, kv. 27, both of Moscow, U.S.S.R.

[22] Filed: Feb. 23, 1973

[21] Appl. No.: 335,157

Related U.S. Application Data

[63] Continuation of Ser. No. 32,870, April 29, 1970, abandoned.

[52] U.S. Cl................... 148/188, 117/200, 148/187, 148/190

[51] Int. Cl. .............................................. H01l 7/34

[58] Field of Search .. 148/186, 187, 188, DIG. 175; 117/200

[56] References Cited

UNITED STATES PATENTS

| | | | |
|---|---|---|---|
| 3,019,142 | 1/1962 | Leinkram | 148/1.5 |
| 3,145,126 | 8/1964 | Hardy | 148/188 X |
| 3,290,189 | 12/1966 | Migitaka et al. | 148/188 |
| 3,486,951 | 12/1969 | Norby | 148/188 |
| 3,511,724 | 5/1970 | Ohta | 148/187 |
| 3,514,348 | 5/1970 | Ku | 148/188 |
| 3,582,724 | 6/1971 | Nakahara et al. | 148/175 X |
| 3,592,705 | 7/1971 | Kawashima et al. | 148/188 X |
| 3,700,507 | 10/1972 | Murray | 148/187 |

OTHER PUBLICATIONS

Miall, "A New Dictionary of Chemistry," Interscience Publishers, 1962, pp. 80, 81.

*Primary Examiner*—Hyland Bizot
*Assistant Examiner*—J. M. Davis

[57] ABSTRACT

A method of making a profiled p-n junction by diffusing substances in a plate of a semiconductive material, which consists in that the surface of a ground semiconductive plate is covered with a solution of a substance to be diffused, for example, boric acid, which is then dried, and in accordance with a predetermined profile of the required p-n junction a protective masking material, for example, bitumen, which is insoluble in a solvent of substances to be diffused, is applied, after which a solution of a second substance to be diffused is applied to the plate, for example, aluminum nitrate, in which the masking protective material is insoluble and which differs from the first substance to be diffused in its diffusion coefficient, the plate is then dried, the protective material is dissolved in a solvent in which substances to be diffused which are applied are insoluble, and the plate is subjected to heat treatment with a view to diffusing the two substances. As an alternative of the method proposed is another method wherein the second substance is diffused into a plate having a p-n junction, to individual areas of its surface.

3 Claims, 4 Drawing Figures

Figures 1A, 1B, 1C, 1D:
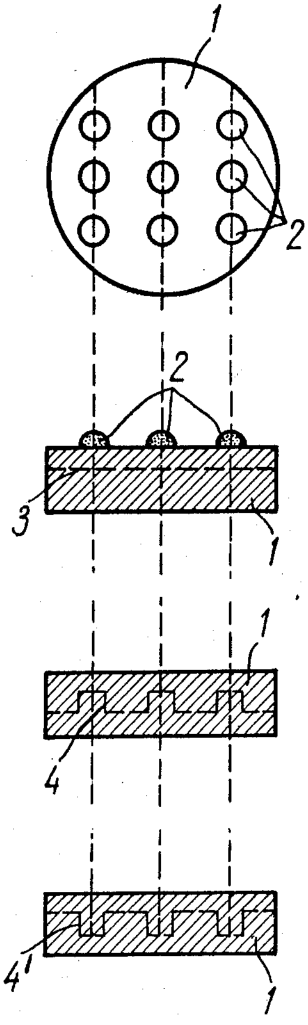

INVENTORS
Ilya Leonidovich Tsitovsky
Grigory Avrumovich Zelikman

Holman, Glascock, Downing & Seebold
ATTORNEYS

METHOD OF MAKING A PROFILED P-N JUNCTION IN A PLATE OF SEMICONDUCTIVE MATERIAL

This is a continuation, of application Ser. No. 32,870, filed Apr. 29, 1970, now abandoned.

The present invention relates to semiconductor devices, and, more particularly, to a method of making a profiled p-n junction in plates of a semiconductive material, used for manufacturing semiconductor devices provided with a "guard ring" to eliminate the phenomenon of the surface break-down.

Known in the art is a method of making a profiled p-n junction in a plate of a semiconductive material having a p-n junction, whereby the edges of a plate are coated by means of a brush with a solution of a substance capable of making in the plate material a p-n junction at a level different from that of the p-n junction that has already been provided in the plate, whereupon the plate is subjected to thermal treatment accompanied by diffusion of the solution into the plate material (cf. the "Electricity" U.S.S.R. journal, No. 7, 1966, pp. 56–59).

A disadvantage of the afore-described method lies in that it does not allow to make a profiled p-n junction in plates whose diameter is smaller than 5–7 mm.

It is an object of the present invention to provide a method of making a profiled p-n junction in semiconductor plates particularly but not exclusively of small sizes (< 5–7 mm).

In conformity with the invention the whole surface of the semiconductive plate is coated with a solution of the first diffusant which can form a first p-n junction insoluble in a solvent; said solution is dried; a protective substance is applied selectively in patches thereon in accordance with a preset profile p-n junction; the plate is then coated with a solution of a second diffusant having a diffusion coefficient differing from that one of the first diffusant; the protective layer is dissolved in a solvent which does not affect the first and second diffusants and the plate should finally undergo diffusion annealing to form a profiled p-n junction.

In case a profiled p-n junction is to be made in a plate of a semiconductive material that has no p-n junction, it is expedient, prior to its coating with a protective patch, to coat the plate surface with a solution of a substance which is capable of forming a p-n junction in the plate, is not soluble in the solvent of the protective layer and has a diffusion coefficient differing from that of the solution of the substance laid on the protective layer.

It is expedient to provide the surface of a silicon plate for example with a p-n junction formed by diffusion of boron with a protective layer of bitumen, and, then, with an aqueous solution of aluminium nitrate, whereupon, with the plate dried, the bitumen is washed off by carbon tetrachloride and the plate is subjected to thermal treatment. By the term "bitumen" herein and in the claims is intended semisolid hydrocarbon mixtures which are soluble in toluene or carbon tetrachloride and which are insoluble in water. It is also expedient to coat the surface of the silicon semiconductor plate having no p-n junction, before it is covered with bitumen, with an aqueous solution of boric acid.

The present method provides for highly precise making of a profiled p-n junction in semiconductor plates particularly of widths or diameters smaller than 5–7 mm.

The following description of exemplary embodiments of the present invention is given with reference to the accompanying drawings, in which:

FIG. 1*a* shows a top view of a semiconductor plate coated with a protective patch;

FIG. 1*b* shows a cross section of a semiconductor plate selectively coated with a protective patch;

FIG. 1*c*, *d* show cross sections of finished semiconductor plates after they have been subjected to thermal treatment, according to the present invention.

The present method is carried out as follows: the surface of a ground and degreased silicon semiconductor plate 1 (FIG. 1*a*) having a p-n junction disposed at a small depth relative to the plate surface, is covered by using a metal mask corresponding to a preset profile of the p-n junction with a protective layer 2 of bitumen. Then the mask is removed from the surface of the plate 1, and a 3–5% aqueous solution of $AL(NO_3)_3$ is deposited onto the plate by means of, for example, a sprayer at the side of the bitumen. Thereupon, the plate is dried at a temperature not exceeding the temperature (~ 40°C) of the bitumen spreading.

FIG. 1*b* shows a cross section of the semiconductor plate 1 having a p-n junction 3 and its surface coated with the protective patch 2 of bitumen. After it is dried, the plate is boiled in carbon tetrachloride in which the aluminium nitrate is not soluble, to remove the bitumen off its surface. As a result of these operations, the surface of the semiconductor plate is covered with a layer of $AL(NO_3)_3$ only in those portions that have not been covered with bitumen. Then, the plate is subjected to thermal treatment which is accompanied by diffusion of aluminium. During the diffusion the aluminium penetrates into the depth of the plate only in those portions that have been covered with the layer of $AL(NO_3)_3$, as a result of which a required profiled p-n junction 4 as seen in the cross section of the plate 1 shown in FIG. 1*c*, is formed in the plate.

To make a profiled p-n junction in a silicon semiconductor plate having no p-n junction, the surface of the preliminarily ground and degreased plate is coated with a saturated solution of boric acid or boric anhydride, whereupon the plate is treated in accordance with the afore-described method.

With the layer of the bitumen removed, the portions of the plate surface that have been protected by the bitumen are covered with a substance comprising boron, whereas the rest of the plate surface is covered with a substance comprising aluminium. In the course of the thermal treatment the aluminium is diffused into the depth of the plate quicker than the boron, as a result of which a p-n junction is formed in the plate, said p-n junction being analogous to the one shown in FIG. 1*c*.

In case it is necessary to make a profiled p-n junction which is a mirror image of the afore-described one and is shown in FIG. 1*d*, the sequence of laying the solutions of $H_3BO_3$ and $AL(NO_3)_3$ should be changed, and the plate surface should be coated with a solution of $AL(NO_3)_3$ before it is covered with the patch of bitumen, and with a solution of $H_3BO_3$ after it is coated with a bitumen patch, the subsequent treatment not differing from the afore-described one.

When carrying out the present method, it is also possible to use other pairs of solutions of substances capable of making a p-n junction, but the substances used should, however, have different diffusion coefficients.

When choosing a protective substance (bitumen in the afore-described example), it is necessary to take into consideration the fact that it should be capable of being soluted in the solvent in which the substances forming a p-n junction in the plate are not soluble.

The present method makes it possible to effect selective local coating and diffusion of any substance by virtue of different solubilities of the protective patch and the substance to be diffused.

The present method is advantageous in that it allows to widen up the obtained parameters of profiled p-n junctions with respect to the depth, surface concentration and gradients of concentration of the admixtures forming a profiled p-n junction.

It is expedient to use the present method for making profiled p-n junctions in semiconductor plates whose diameter exceeds 0.1 mm.

What is claimed is:

1. A method of diffusion forming a profiled p-n junction in a plate of semiconductive material, comprising: covering a surface of the plate with a solution of a first substance to be diffused and drying the applied solution; selectively applying by the use of a mask, a patch of a protective material in accordance with a predetermined profile, the protective material not dissolving in the solvent of said solution of a first substance; applying on the layer of the first substance to be diffused, having a layer of protective material thereon, a solution of a second substance to be diffused which does not affect the layer of protective material; drying the applied solution of the second substance; removing the protective layer by subjecting the semiconductive plate to a solvent which does not dissolve the first and second substances; and subjecting the semiconductive plate to thermal treatment to form the required profiled p-n junction by diffusing said first and second substances.

2. A method according to claim 1 in which the plate of semiconductive material is a silicon-plate with said first p-n junction formed by diffusion of boron, and said protective layer comprises bitumen, the substance forming said second p-n junction being aluminum nitrate, said solvent for the protective layer comprising carbon tetrachloride.

3. A method according to claim 1 wherein the plate of semiconductive material is a silicon-plate and said first p-n junction is formed thereon by means of boric acid diffusion.

* * * * *